(12) United States Patent
Daubenspeck et al.

(10) Patent No.: US 8,159,067 B2
(45) Date of Patent: Apr. 17, 2012

(54) UNDERFILL FLOW GUIDE STRUCTURES

(75) Inventors: Timothy H. Daubenspeck, Colchester, VT (US); Jeffrey P. Gambino, Westford, VT (US); Christopher D. Muzzy, Burlington, VT (US); Marie-Claude Paquet, Bromont (CA); Wolfgang Sauter, Richmond, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 12/190,612

(22) Filed: Aug. 13, 2008

(65) Prior Publication Data
US 2010/0038780 A1     Feb. 18, 2010

(51) Int. Cl.
*H01L 23/48*     (2006.01)
(52) U.S. Cl. ........ 257/738; 257/778; 257/782; 257/788; 257/789; 257/795; 257/E21.503; 257/E23.069
(58) Field of Classification Search .................. 257/738, 257/778, 782, 788, 789, 795, E21.503, E23.069
See application file for complete search history.

(56) References Cited

U.S. PATENT DOCUMENTS

| | | | |
|---|---|---|---|
| 5,218,234 A * | 6/1993 | Thompson et al. | 257/787 |
| 5,942,798 A * | 8/1999 | Chiu | 257/737 |
| 6,294,840 B1 * | 9/2001 | McCormick | 257/778 |
| 6,614,122 B1 * | 9/2003 | Dory et al. | 257/787 |
| 6,774,493 B2 * | 8/2004 | Capote et al. | 257/778 |
| 6,821,878 B2 * | 11/2004 | Danvir et al. | 438/613 |
| 6,916,684 B2 * | 7/2005 | Stepniak et al. | 438/108 |
| 7,033,864 B2 * | 4/2006 | Libres et al. | 438/118 |
| 7,169,693 B2 | 1/2007 | Akram et al. | |
| 7,795,075 B2 * | 9/2010 | Uemura et al. | 438/108 |
| 2005/0014313 A1 * | 1/2005 | Workman et al. | 438/127 |
| 2008/0023833 A1 | 1/2008 | Daubenspeck et al. | |
| 2008/0277802 A1 * | 11/2008 | Tsai et al. | 257/778 |

\* cited by examiner

*Primary Examiner* — Andy Huynh
(74) *Attorney, Agent, or Firm* — Richard Kotulak; Roberts Mlotkowski Safran & Cole, P.C.

(57) ABSTRACT

Underfill flow guide structures and methods of using the same are provided with a module. In particular the underfill flow guide structures are integrated with a substrate and are configured to prevent air entrapment from occurring during capillary underfill processes.

11 Claims, 6 Drawing Sheets

Non-uniform Underfill Flow front

Flow path of Underfill voids

Diverging Pattern

UNDERFILL FLOW GUIDE STRUCTURES

FIELD OF THE INVENTION

The invention relates to underfill flow guide structures and methods of using the same and, in particular, to underfill flow guide structures which prevent air entrapment from occurring during capillary underfill processes.

BACKGROUND

In typical manufacturing processes, a large number of semiconductor devices are formed on a singe wafer. After the semiconductor devices are formed, the wafer is sliced and diced so that each individual semiconductor device is separated from the others formed on the wafer. The individual semiconductor devices are then packaged. Packaging provides physical protection and also dissipates heat from the semiconductor. The packaging, for example, in flip chip technology, also provides leads between individual chips and an exterior of the package. The leads provide electrical connection between the chip and a printed circuit board or other device.

In flip chip technology, for example, a series of C4 bumps are formed in an array on a surface of the flip chip. In the packaging, the C4 bumps are attached to a substrate. One method of such packaging includes underfill. In fact, underfill is required for almost all C4 products to, for example, prevent C4 corrosion and C4 fatigue fails due to thermal mismatch.

The standard industry process to apply underfill is through a capillary flow underfill process. In this process, underfill is dispensed along one or multiple edges of the chip and then flows under the chip by capillary action. However, it is known that the flow of the underfill is irregular and unpredictable and can lead to voids around C4 bumps. These voids can allow for C4 corrosion and dendritic growth, as well as thermal fatigue of C4s due to CTE mismatch between the chip and the substrate. These problems can ultimately lead to device failure and yield loss.

For example, as shown illustratively in FIG. 1A, during the capillary action the underfill has an irregular flow front, which becomes even more pronounced in finer pitched C4 products. As different portions of the flow front converge, voids or air pockets can develop around the C4 bumps, as shown in FIG. 1B. Analysis under acoustic microscopy has shown that flow fronts of the underfill can converge, resulting in entrapped air (caused by the non-uniform underfill flow). Large entrapments of air or voids are considered yield loss. The entrapment of air due to non-uniform underfill flow underneath the chip is of especial concern for fine-pitch solutions, which are required for newer technology chips.

Accordingly, there exists a need in the art to overcome the deficiencies and limitations described hereinabove.

SUMMARY

In a first aspect of the invention, a structure comprises a substrate having bumps mounted thereon and underfill flow guide structures. The underfill flow guide structures integrated with the substrate are configured to uniformly guide underfill along the substrate during capillary underfill processing.

In another aspect of the invention, a module comprises a substrate having C4 bumps mounted thereon and a carrier mounted to the substrate by the C4 bumps. Underfill is injected within a space formed between the substrate and the carrier. Underfill flow guide structures integrated with the substrate are configured to uniformly guide the underfill along the substrate and within the space during underfill processing.

In still a further aspect of the invention, a method of forming a module comprising: injecting underfill within a space of the module at one or more edges of a substrate forming the module; and directing the underfill with a substantially uniform flow front with the space of the module by underfill flow guide structures integrated with the substrate, thereby providing an underfill devoid of voids.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. It is noted that, according to common practice, the various features of the drawing are not to scale, and the dimensions of the various features are arbitrarily expanded or reduced for clarity.

DETAILED DESCRIPTION

The invention relates to underfill flow guide structures and methods of using the same and, in particular, to underfill flow guide structures which prevent air entrapment from occurring during underfill capillary processes. In implementation, the underfill flow guide structures (topography) are integrated with the substrate (chip) to provide an improved flow path for the underfill flow. The underfill flow guide structures can be integrated via a raised structure or a trench or trough as discussed herein. Advantageously, the underfill flow structures (e.g., guides) increase flow speed and prevent underfill voids. The underfill flow guide structures of the present invention can be implemented within the traditional flow of wafer and/or substrate processing.

Structures in Accordance with the Invention

Figure 1A:
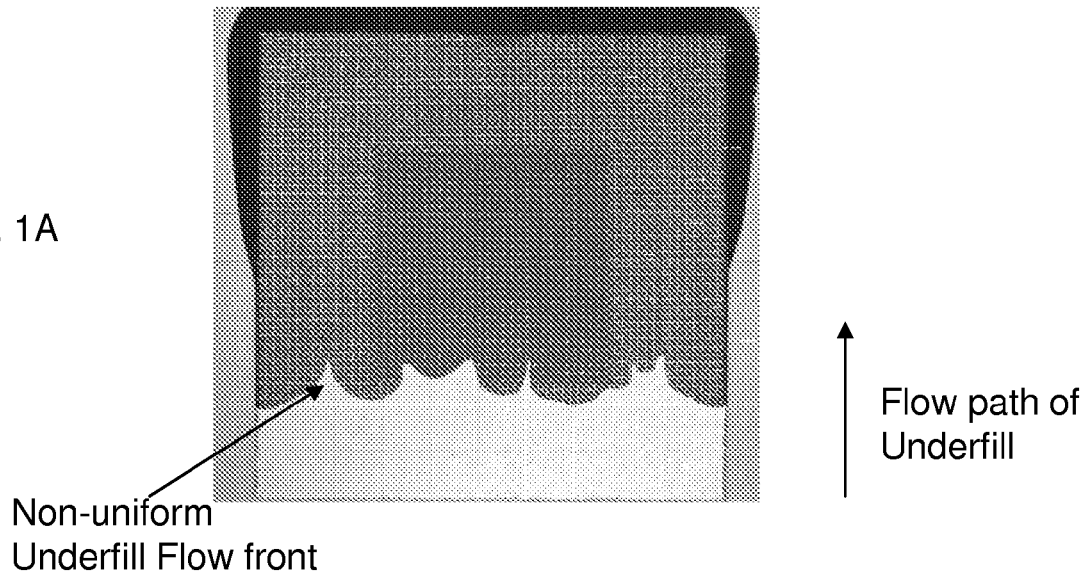
FIG. 1A shows a non-uniform flow front of an underfill material.
Figure 1B:
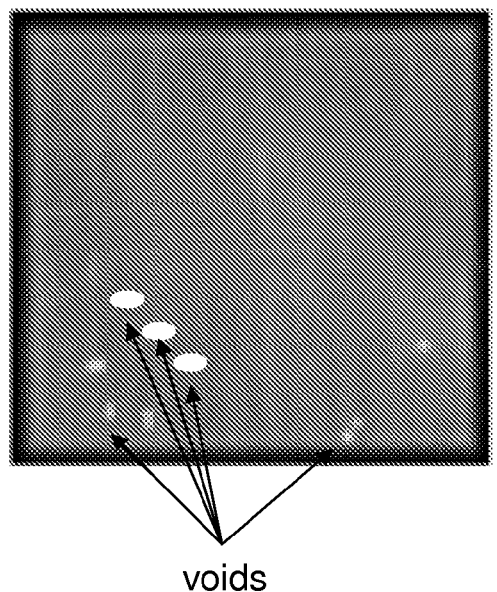
FIG. 1B shows the formation of voids around C4 bumps.
Figure 2A:
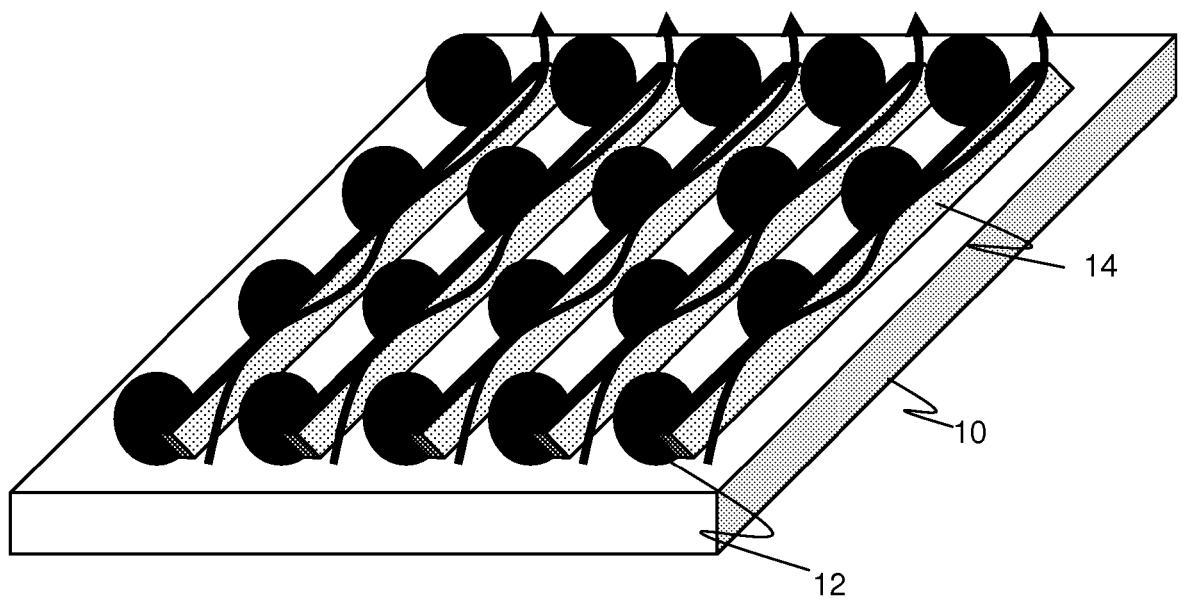
FIG. 2A shows underfill flow guide structures in accordance with a first aspect of the invention.

FIG. 2A shows underfill flow guide structures in accordance with a first aspect of the invention. In particular, the underfill flow guide structures 14 are provided on a chip 10 and act as flow paths for underfill as represented by the arrows in FIG. 2A. In this illustrative embodiment, C4 bumps 12 are mounted to the chip (substrate) 10 (and adjacent to the underfill flow guide structures 4) using conventional technologies. In accordance with a first aspect of the invention, the underfill flow guide structures 14 are raised three dimensional structures, which create topography on the chip 10.

In accordance with the first aspect of the invention, the underfill flow guide structures 14 are configured to run parallel to one another as well as two edges of the chip 14. The underfill flow guide structures 14 are also adjacent to the C4 bumps 12 and are configured to extend to opposing edges of the chip 10. The underfill flow guide structures 14 can also be provided at the edges of the chip 10. It should be understood that many different patterns and shapes of the underfill flow guide structures 14 are contemplated by the present invention such as, for example, straight, divergent, sinusoidal, a combination thereof, etc. In addition or alternatively, the pattern of the underfill flow guide structures 14 can also be intermittent, extend from an edge to an area within the chip, from edge to edge, overlap or criss-cross, etc. Also, as noted above, it should be understood that the various features of the drawing are not to scale, and the dimensions of the various features are arbitrarily expanded or reduced for clarity.

In embodiments, the underfill flow guide structures 14 can be fabricated during wafer level processing. For example, the underfill flow guide structures 14 can be fabricated from a photosensitive polyimide (PSPI) film during the wafer fabrication process, and more preferably with a second layer of material (e.g., PSPI). It should be understood that other materials such as other passivation materials (e.g., oxide, etc.) are also be contemplated by the present invention. In further embodiments, the underfill flow guide structures 14 can be patterned from wires (or other topographies on the chip 10) with an overlay of a hard passivation layer In further embodiments, for example, the underfill guide flow structures 14 can be formed using a greytone mask, as should be understood by those of skill in the art.

Figure 2B:
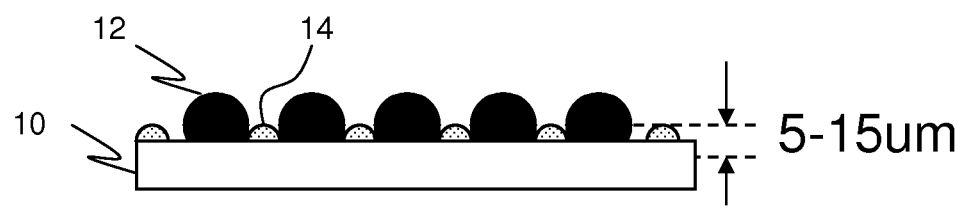
FIG. 2B shows a side view of the underfill flow guide structures of FIG. 2A.

FIG. 2B shows a side view of the underfill flow guide structures of FIG. 2A. As shown in FIG. 2B, the underfill flow guide strictures 14 are positioned between the C4 bumps 12. In embodiments, the underfill flow guide structures 14 are about 5-15 μm in height and preferably have an aspect ratio of 1:1; although other aspect ratios are also contemplated by the present invention. For example, the underfill flow guide structures can be about 4 microns high when formed from wires and an overlay of hard passivation. Also, although the underfill flow guide structures 14 are shown as oval in shape, other shapes are also contemplated by the present intention such as, for example, circular, rectangular, triangular or an irregular shape, depending on the manufacturing processes.

Figure 3A:
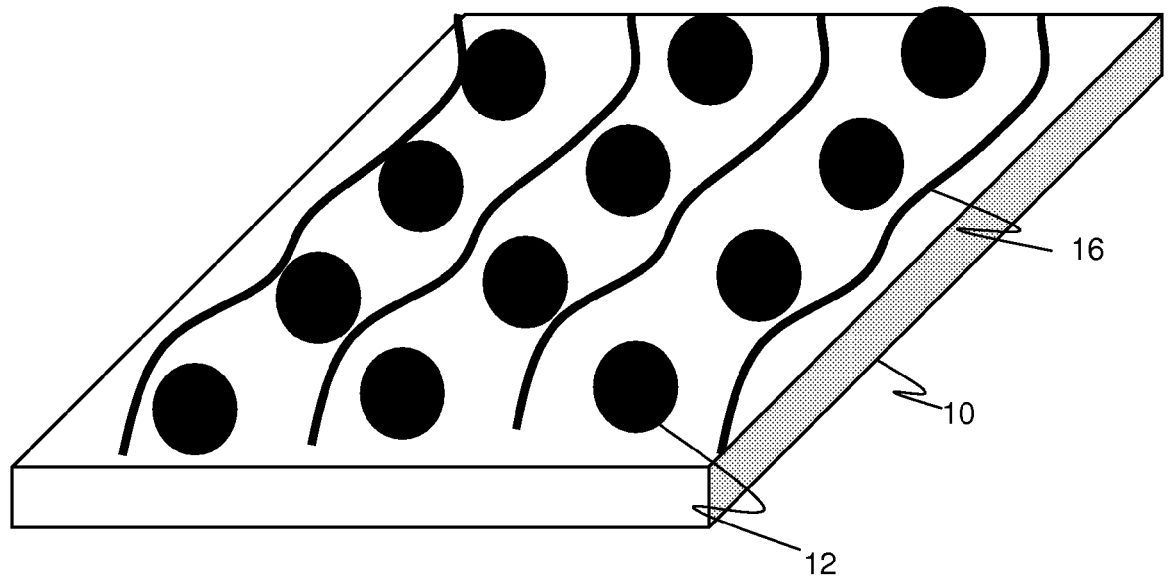
FIG. 3A shows underfill flow guide strictures in accordance with a second aspect of the invention.

FIG. 3A shows underfill flow guide strictures in accordance with a second aspect of the invention. In particular, the underfill flow guide structures 16 may be trenches or troughs which create a topography in the chip 10. The underfill flow guide structures 16 may include a wavy or sinusoidal pattern, a straight line or other desired flow path depending on the C4 bump pattern. It should be understood that many different patterns and shapes of the underfill flow guide structures 14 are contemplated by the present invention such as, for example, straight, divergent, sinusoidal, a combination thereof, etc. In addition or alternatively, the pattern of the underfill flow guide structures 14 can also be intermittent, extend from an edge to an area within the chip, from edge to edge, overlap or criss-cross, etc.

As in the first aspect of the invention, the underfill flow guide structures 16 are adjacent to the C4 bumps 12 will act as flow paths for the underfill as it flows past the C4 bumps 12. In this illustrative embodiment, the underfill flow guide structures 16 can be patterned into the oxide film of the chip 10, for example. The underfill flow guide structures 14 are also adjacent to the C4 bumps 12 and can be at edges of the chip 10.

Also, as noted above, in embodiments the underfill flow guide structures 16 can be fabricated during wafer level processing. For example, the underfill flow guide structures 16 can be formed through an etching process in a passivation material such as, for example, oxide films.

Figure 3B:
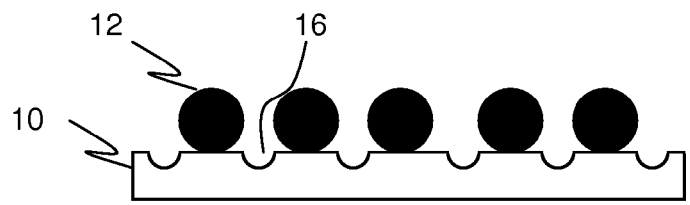
FIG. 3B shows a side view of the underfill flow guide structures of FIG. 3A.

FIG. 3B shows a side view of the underfill flow guide structures of FIG. 3A. As shown in FIG. 3B, the underfill flow guide strictures 16 are positioned between the C4 bumps 10. In embodiments, the underfill flow guide structures 16 are about 2 microns deep when formed in an underlying oxide film. Also, although the underfill flow guide structures 16 are shown as semi-circular in shape, other shapes are also contemplated by the present invention such as, for example, semi-oval, semi-rectangular, triangular or an irregular shape, depending on the manufacturing processes.

Figure 4:
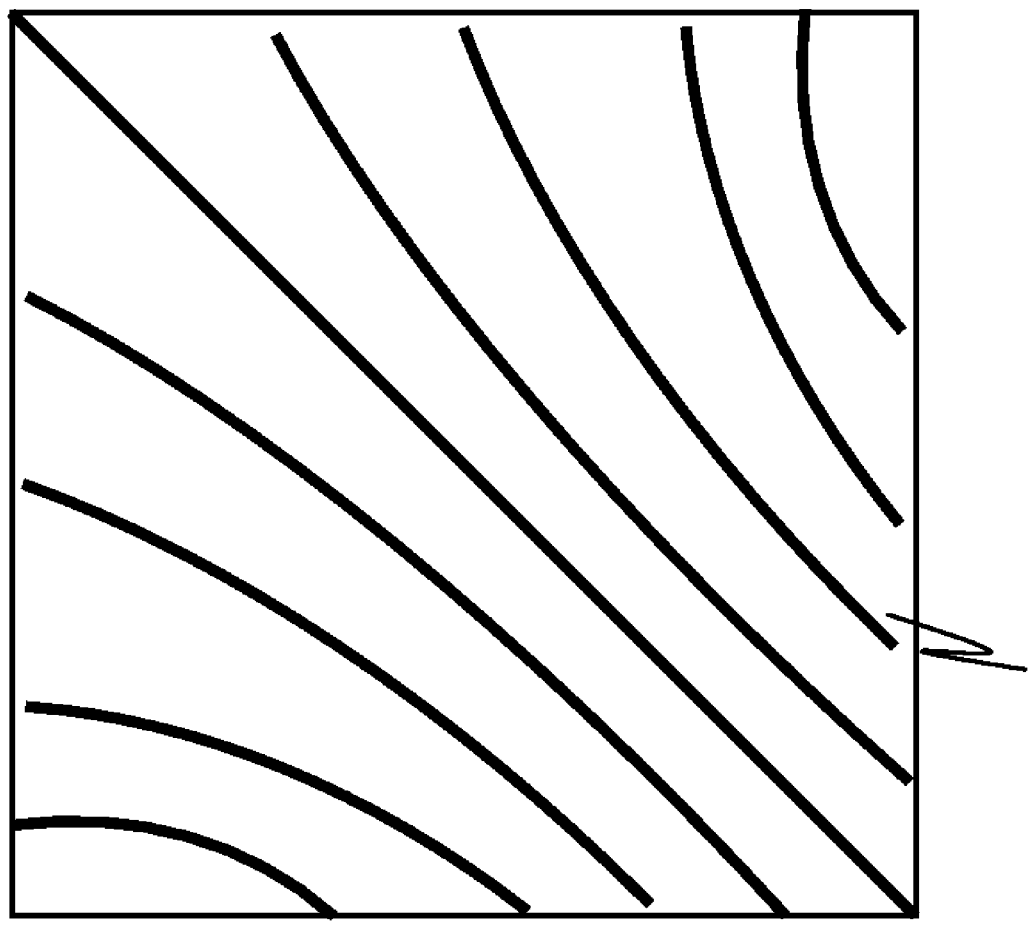
FIG. 4 shows underfill flow guide strictures in accordance with another aspect of the invention.

FIG. 4 shows underfill flow guide structures in accordance with another aspect of the invention. In this aspect of the invention, underfill flow guide structures 18 are in a divergent pattern. In embodiments, the underfill flow guide structures 18 of this aspect of the invention may be formed by the processes described above, e.g., raised three dimensional structures, trenches or troughs. In further embodiments, the underfill flow guide structures 18 can be formed using a grey tone mask. In this implementation, the grey tone can be used to form a structure in the PSPI, as should be understood by those of skill in the art. The pattern of the underfill flow guide structures 14 can also be intermittent, extend from an edge to an area within the chip, from edge to any other edge, overlap or crisscross, etc.

Figure 5:
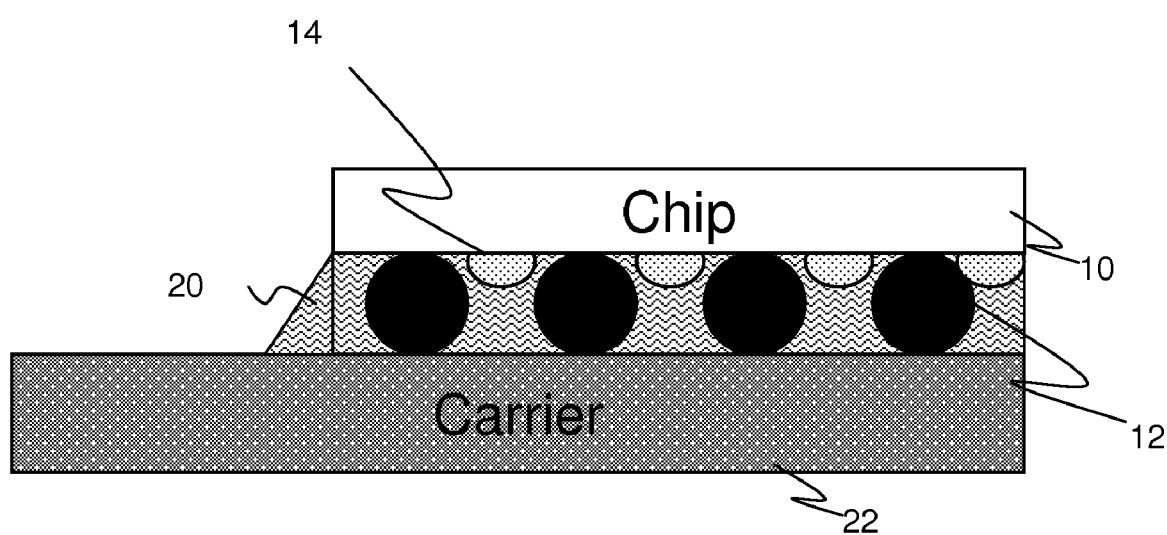
FIG. 5 shows a package using the underfill flow guide structure in accordance with aspects of the invention.

FIG. 5 shows a package using the underfill flow guide structures in accordance with aspects of the invention. As shown in FIG. 5, using the underfill flow guide structures 14 (or the underfill flow guide structures 16 or 18 or any combination thereof), underfill 20 completely fills the space between the chip 10 and a carrier 22. As such, the underfill flow guide structures of the present invention prevent air entrapment and hence prevent voids from forming about the C4 bumps. This is due to the fact that the underfill flow guide structure prevent an irregular flow front of the underfill during capillary action, i.e., provide a uniform flow front.

Methods in Accordance with the Invention

Figures 6A, 6B, 6C:
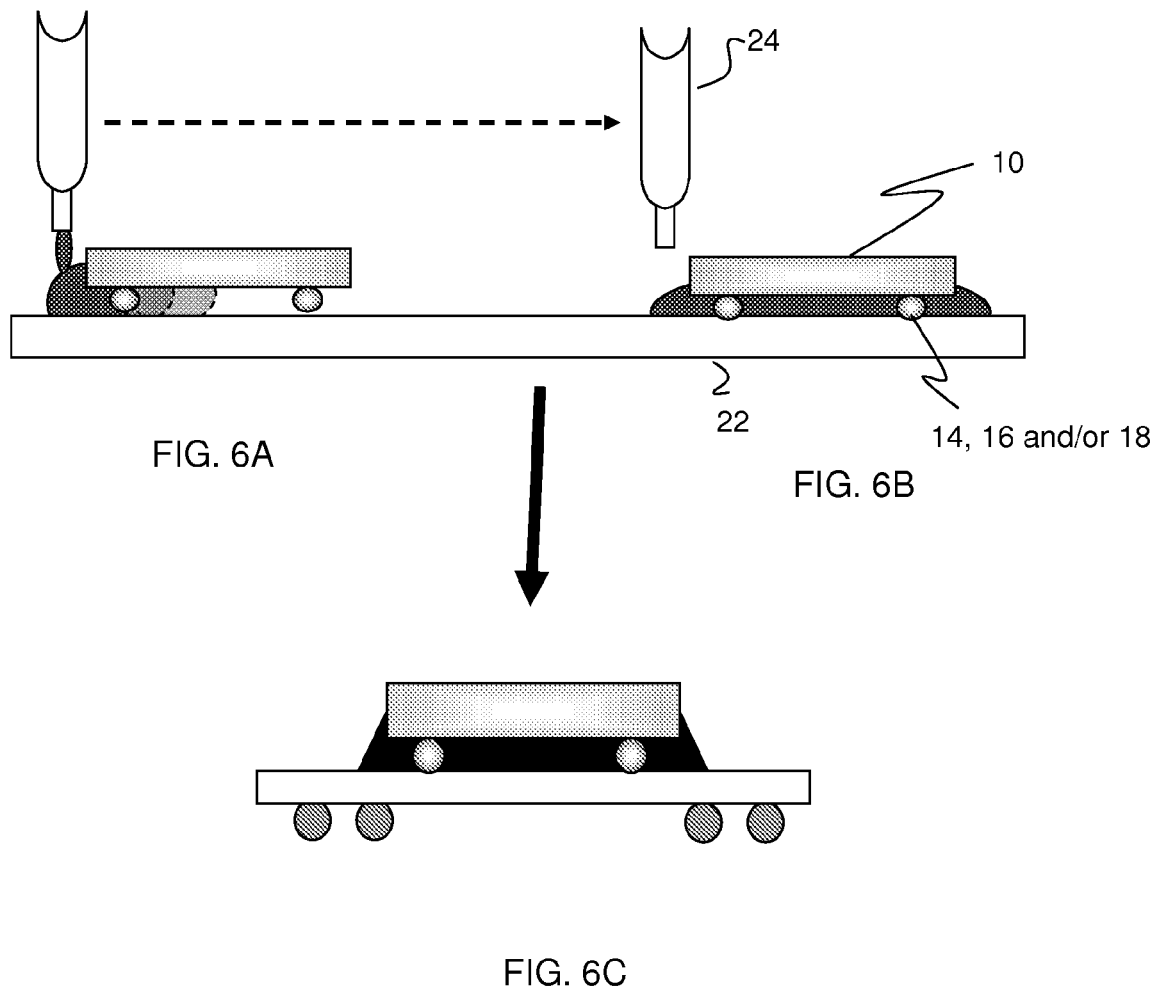
FIGS. 6A-6C show an underfill process implemented with the underfill flow guide structures in accordance with the invention.

FIGS. 6A-6C show an underfill process implemented with the underfill flow guide structures in accordance with the invention. As shown in FIG. 6A, the underfill is initially injected at an edge of the chip 10 by an underfill tool 24, known to those of skill in the art. As shown in FIG. 6B, as the underfill is injected at the edge of the chip 10, the underfill is guided by the underfill flow guide structures (14, 16 and/or 18), which provide a uniform flow path of the underfill. In this process, the underfill fills the entire space between the chip 10 and the substrate 22, directed by the underfill flow guide structures. FIG. 6C represents the curing process of the underfill module.

Fabrication of Integrated Circuit Chips

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form discloses. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A structure comprising:
    a substrate having bumps mounted thereon; and
    underfill flow guide structures integrated with the substrate and located between adjacent bumps, and configured to uniformly guide underfill along the substrate during capillary underfill processing, wherein:
        the underfill flow guide structures are raised three dimensional structures on the substrate; and
        the underfill flow guide structures are wires with a overlay of a hard substance.

2. The structure of claim 1, wherein the bumps are controlled collapse chip connections (C4).

3. The structure of claim 1, wherein the underfill flow guide structures are at a height of about 4 microns.

4. The structure of claim 3, wherein the hard substance is a polyimide layer.

5. The structure of claim 1, wherein the underfill flow guide structures are in a pattern of at least one of: parallel, divergent, sinusoidal, intermittent, extending from an edge to an area within the chip, from edge to edge and overlap or criss-cross.

6. The structure of claim 1, wherein the underfill flow guide structures run parallel to opposing edges of the substrate and at least one row of the bumps.

7. The structure of claim 1, wherein the underfill flow guide structures are sinusoidal.

8. The structure of claim 1, wherein the underfill flow guide structures diverge.

9. A module, comprising:
    a substrate having C4 bumps mounted thereon and in contact therewith;
    a carrier mounted to the substrate by the C4 bumps;
    underfill within a space formed between the substrate and the carrier; and
    underfill flow guide structures integrated with the substrate and located between adjacent bumps, and configured to uniformly guide the underfill along the substrate and within the space during underfill processing, wherein the underfill flow guide structures are wires with a overlay of a hard substance.

10. The module of claim 9, wherein the hard substance is a polyimide layer.

11. The module of claim 9, wherein the underfill flow guide structures are in a pattern of at least one of: parallel, divergent, sinusoidal, intermittent, extend from an edge to an area within the chip, from edge to edge and overlap or criss-cross.

* * * * *